(12) United States Patent
Chen et al.

(10) Patent No.: US 10,516,029 B2
(45) Date of Patent: *Dec. 24, 2019

(54) DISHING PREVENTION DUMMY STRUCTURES FOR SEMICONDUCTOR DEVICES

(71) Applicant: Taiwan Semiconductor Manufacturing Co., Ltd., Hsin-Chu (TW)

(72) Inventors: Yi-Huan Chen, Hsin Chu (TW); Chien-Chih Chou, New Taipei (TW); Ta-Wei Lin, Minxiong Township (TW); Fu-Jier Fan, Hsinchu (TW); Kong-Beng Thei, Pao-Shan Village (TW); Yi-Sheng Chen, Hsinchu (TW); Szu-Hsien Liu, Zhubei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/437,137

(22) Filed: Jun. 11, 2019

(65) Prior Publication Data

US 2019/0296121 A1    Sep. 26, 2019

Related U.S. Application Data

(63) Continuation of application No. 15/964,572, filed on Apr. 27, 2018, now Pat. No. 10,340,357.

(Continued)

(51) Int. Cl.
*H01L 29/49* (2006.01)
*H01L 29/06* (2006.01)
(Continued)

(52) U.S. Cl.
CPC .......... *H01L 29/4916* (2013.01); *H01L 21/76* (2013.01); *H01L 21/76229* (2013.01);
(Continued)

(58) Field of Classification Search
None
See application file for complete search history.

(56) References Cited

U.S. PATENT DOCUMENTS

| 10,340,357 B2 * | 7/2019 | Chen | H01L 21/76 |
| 2004/0089950 A1 * | 5/2004 | Nanjo | H01L 21/76229 |
| | | | 257/758 |

(Continued)

OTHER PUBLICATIONS

Thomas Y. Hoffmann. Integrating High-K/Metal Gates: Gate-First or Gate-Last? Solid State Technology. Published in 2017.

(Continued)

*Primary Examiner* — J. E. Schoenholtz
(74) *Attorney, Agent, or Firm* — Eschweiler & Potashnik, LLC

(57) ABSTRACT

In some embodiments, an integrated circuit is provided. The integrated circuit may include an inner ring-shaped isolation structure that is disposed in a semiconductor substrate. Further, the inner-ring shaped isolation structure may demarcate a device region. An inner ring-shaped well is disposed in the semiconductor substrate and surrounds the inner ring-shaped isolation structure. A plurality of dummy gates are arranged over the inner ring-shaped well. Moreover, the plurality of dummy gates are arranged within an interlayer dielectric layer.

20 Claims, 10 Drawing Sheets

Related U.S. Application Data

(60) Provisional application No. 62/562,564, filed on Sep. 25, 2017.

(51) Int. Cl.
    *H01L 29/40* (2006.01)
    *H01L 27/088* (2006.01)
    *H01L 21/8234* (2006.01)
    *H01L 21/76* (2006.01)
    *H01L 21/762* (2006.01)

(52) U.S. Cl.
    CPC .... *H01L 21/823437* (2013.01); *H01L 27/088* (2013.01); *H01L 29/0603* (2013.01); *H01L 29/401* (2013.01); *H01L 21/823481* (2013.01)

(56) References Cited

U.S. PATENT DOCUMENTS

| | | |
|---|---|---|
| 2007/0221957 A1 | 9/2007 | Kitajima et al. |
| 2011/0156149 A1 | 6/2011 | Wang et al. |
| 2011/0233717 A1* | 9/2011 | Jensen .............. H01L 21/76229 257/503 |
| 2012/0256310 A1 | 10/2012 | Ide |
| 2013/0320396 A1 | 12/2013 | Salman et al. |
| 2017/0125401 A1 | 5/2017 | Gu et al. |
| 2019/0103367 A1 | 4/2019 | Chen et al. |

OTHER PUBLICATIONS

Non Final Office Action dated Apr. 2, 2019 in connection with U.S. Appl. No. 15/935,363.

Non-Final Office Action dated Jan. 31, 2019 for U.S. Appl. No. 15/964,572.

Notice of Allowance dated May 1, 2019 for U.S. Appl. No. 15/964,572.

* cited by examiner

DISHING PREVENTION DUMMY STRUCTURES FOR SEMICONDUCTOR DEVICES

REFERENCE TO RELATED APPLICATIONS

This Application is a Continuation of U.S. application Ser. No. 15/964,572, filed on Apr. 27, 2018, which claims the benefit of U.S. Provisional Application No. 62/562,564, filed on Sep. 25, 2017. The contents of the above-referenced Patent Applications are hereby incorporated by reference in their entirety.

BACKGROUND

Integrated chips comprise millions or billions of transistor devices. Modern day integrated chips generally comprise a variety of transistors that are capable of operating a different voltages. High voltage devices are widely used in power management, regulators, battery protectors, DC motors, automotive circuits, panel display drivers, etc. On the other hand, low voltage devices are typically used for logic cores, microprocessors, and microcontrollers. Some modern integrated circuit (IC) designs integrate both high voltage and low voltage devices on a single chip. In both high voltage and low voltage technologies, functional density (e.g., the number of devices per chip area) has generally increased while feature size (e.g., the smallest component (or line) that can be created using a fabrication process) has decreased. However, the increase in functional density and decrease in feature size has caused both low voltage and high voltage devices to suffer leakage and other undesirable dimensional based effects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
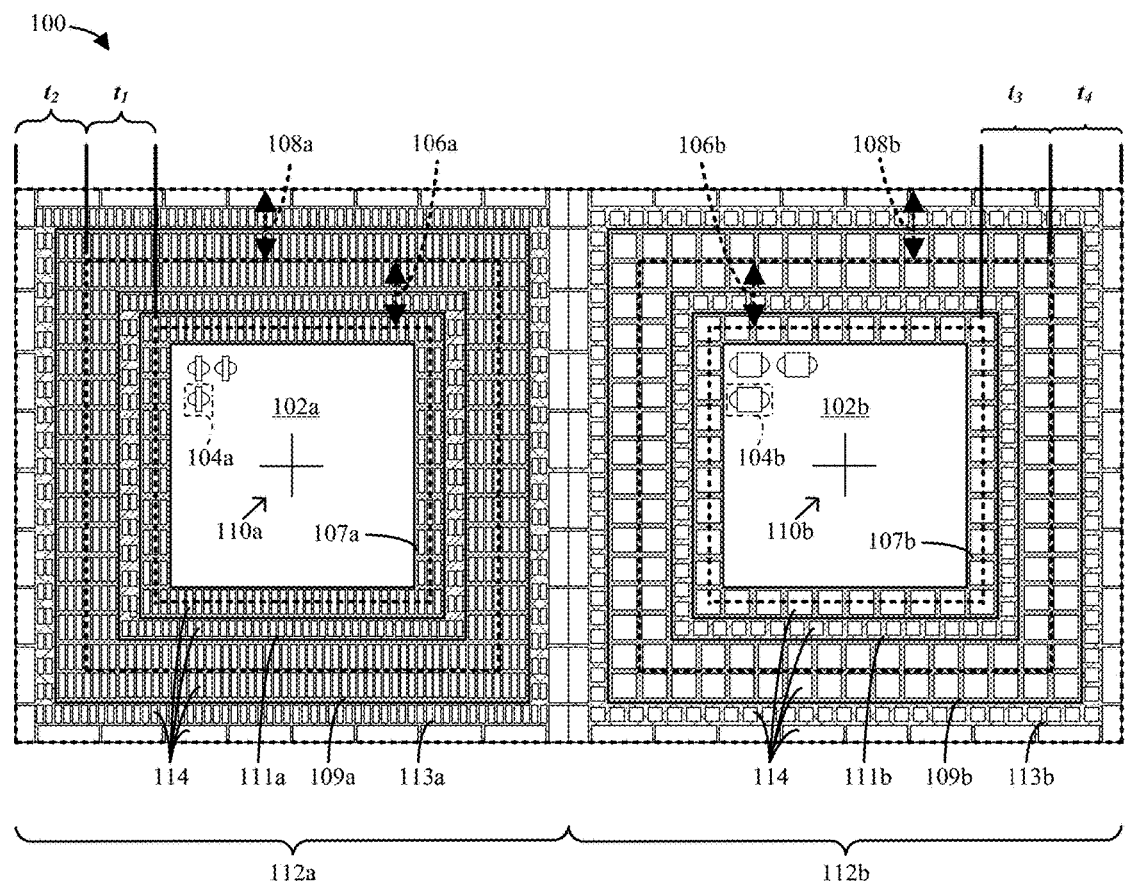
FIG. 1 illustrates a top view of some embodiments of an integrated circuit comprising first and second IC regions having dishing prevention dummy gates.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper", and the like, may be used herein for ease of description to describe one element or feature's relationship to another element(s) or feature(s) as illustrated in the figures. The spatially relative terms are intended to encompass different orientations of the device or apparatus in use or operation in addition to the orientation depicted in the figures. The device or apparatus may be otherwise oriented (rotated 90 degrees or at other orientations) and the spatially relative descriptors used herein may likewise be interpreted accordingly. Even more, the terms "first", "second", "third", "fourth", and the like are merely generic identifiers and, as such, may be interchanged in various embodiments. For example, while an element (e.g., an etch, a dielectric layer, or a substrate) may be referred to as a "first" element in some embodiments, the element may be referred to as a "second" element in other embodiments.

As the feature size of integrated chip devices has decreased, electrical isolation between adjacent devices has become more difficult. Generally, electrical isolation is achieved by way of isolation structures disposed within a substrate. For example, isolation between adjacent devices can be achieved by way of shallow trench isolation (STI) structures and/or by guard rings. While, such structures generally provide for good electrical isolation between adjacent devices, other leakage paths also exist.

For example, during the fabrication of semiconductor devices, chemical-mechanical planarization (CMP) processes are widely used to form planar surfaces. When CMP processes are performed on interfaces having different materials, the different materials may be removed at different rates. The removal of different materials at different rates will result in some areas of the interface being recessed relative to other areas, an effect commonly known as "dishing." When a CMP process is performed on a dielectric layer that is disposed over a first and second plurality of devices, the CMP process will remove portions of the dielectric layer, for example, to expose underlying features of the devices (e.g., a sacrificial gate) for subsequent processing (e.g., etching for a replacement poly-gate (RPG) process) and/or provide a uniform height for the underlying features (e.g., to form a uniform metal gate height) of the devices and the dielectric layer.

However, due to the process parameters of the CMP process(es) (e.g., chemical slurry composition, pressure, velocity, time, etc.) and the various types of materials disposed within the dielectric layer (e.g., dielectric, metal, polysilicon, etc.), the CMP process(es) may cause dishing in the dielectric layer (as the various materials are removed at different rates during the CMP process) between adjacent devices. During a subsequent metallization process (e.g., replacing polysilicon gates with a conductive material), the lower regions of the dielectric layer may be filled with a conductive metal, resulting in leakage paths between the adjacent devices. In the case of high voltage devices, this problem can be aggravated due to dielectric breakdown caused by the high voltages of the devices. In some severe instances, the dishing may cause improperly functioning devices.

The present disclosure pertains to an integrated circuit having a first IC region and a second IC region. The first IC region comprises a first device region (e.g., a low voltage region) that has a plurality of first devices. The second IC region comprises a second device region (e.g., a mid voltage region) that has a plurality of second devices. The first IC region has a first inner ring-shaped well (i.e., a first guard ring) that surrounds the first device region and a first outer ring-shaped well that surrounds the first inner ring-shaped well. The second IC region has a second inner ring-shaped well (i.e., a second guard ring) that surround the second device region and a second outer ring-shaped well that surrounds the second inner ring-shaped well. A plurality of dishing prevention dummy gates are disposed within a dielectric layer over an upper surface of both the first IC region and the second IC region. The dishing prevention dummy gates provide structural support during fabrication of the IC to mitigate the amount of dishing of the dielectric layer. Accordingly, the performance of the underlying devices may be improved and the cost of manufacturing ICs may be reduced.

FIG. 1 illustrates a top view of some embodiments of an integrated circuit 100 comprising a first IC region having dishing prevention dummy gates and a second IC region having dishing prevention dummy gates.

The integrated circuit (IC) 100 has a first IC region 112a having a first device region 102a and a second IC region 112b having a second device region 102b. In some embodiments, the first device region 102a comprises a plurality of first devices 104a, and the second device region 102b comprises a plurality of second devices 104b. In some embodiments, the first devices 104a and the second devices 104b may be low voltage devices (e.g., operating voltage of approximately 1.2 eV), mid-voltage devices (e.g., operating voltage of approximately 6.0 eV), or high voltage devices (e.g., operating voltage of approximately 1,000 eV). In yet further embodiments, the first device region 102a may comprise one type of devices (e.g., low voltage, mid-voltage, or high voltage) and the second device region 102b may comprise one type of device. The low voltage, mid-voltage, or high voltage devices may be for example, metal-oxide-semiconductor field effect transistors (MOSFETs), complementary MOS (CMOS) transistors, laterally diffused MOS (LDMOS) transistors, high power MOS transistors, FinFET, and/or other types of devices.

The first device region 102a is surrounded by a first inner ring-shaped well 106a. The first inner ring-shaped well 106a is disposed within an underlying semiconductor substrate and comprises a first doping type (e.g., n-type). The first inner ring-shaped well 106a is separated from the first device region 102a by a first inner isolation structure 107a (e.g., a shallow trench isolation (STI)). The first inner ring-shaped well 106a comprises a first inner highly doped region 111a (e.g., n+) having the first doping type and is disposed between the first inner isolation structure 107a and a first outer isolation structure 109a. In some embodiments, a contact (not shown) is coupled to the first inner highly doped region 111a of the first inner ring-shaped well 106a and is configured to provide a first electric potential (e.g., a low relative voltage or a high relative voltage). Accordingly, the first inner ring-shaped well 106a may act as a protection element (i.e., a first guard ring) for devices disposed on the IC 100 by collecting unwanted electrical signals that may propagate in/out of the first device region 102a and disrupt (e.g., latch-up, unwanted activation, etc.) the function of the devices disposed on the IC.

In some embodiments, the first inner ring-shaped well 106a has a first inner ring-shaped well thickness, $t_1$, which defines a width of the first inner ring-shaped well 106a and may be substantially the same at various points around the first device region 102a, measured from a perimeter of the first device region 102a to a perimeter of the first inner ring-shaped well 106a. The first inner ring-shaped well thickness, $t_1$, may be based, at least in part, on the type of devices (e.g., low voltage, mid-voltage, or high voltage) disposed within the first device region 102a.

In some embodiments, the first inner ring-shaped well 106a is surrounded by a first outer ring-shaped well 108a. In yet further embodiments, the first inner ring shaped well 106a and the first outer ring-shaped well 108a are concentric about a first center point 110a of the first device region 102a. The first outer ring-shaped well 108a is disposed within the underlying semiconductor substrate and comprises a second doping type (e.g., p-type) that is opposite the first doping type. The first outer ring-shaped well 108a is separated from the first inner ring-shaped well 106a by a first outer isolation structure 109a (e.g., STI). The first outer ring-shaped well 108a comprises a first outer highly doped region 113a (e.g., p+) having the second doping type and is disposed between the first outer isolation structure 109a and the perimeter of the first IC region 112a. In some embodiments, a contact (not shown) is coupled to the first outer highly doped region 113a of the first outer ring-shaped well 108a and is configured to provide a second electric potential opposite the first electric potential (e.g., either a high relative voltage or a low relative voltage). Accordingly, the first inner ring-shaped well 106a and the first outer ring-shaped well 108a act as protection elements (i.e., guard rings) for devices disposed on the IC 100 by providing a p-n junction isolation that prevents unwanted current from flowing in/out the first device region 102a and disrupting the function of devices disposed on the IC 100.

The first outer ring-shaped well 108a has a first outer ring-shaped well thickness, $t_2$, which defines a width of the first outer ring-shaped well 108a and may be substantially the same at various points around the first inner ring-shaped well 106a, measured from a perimeter of the first inner ring-shaped well 106a to a perimeter of the first outer ring-shaped well 106b. The first outer ring-shaped well thickness, $t_2$, may be based, at least in part, on the type of devices (e.g., low voltage, mid-voltage, or high voltage) disposed within the first device region 102a. In some embodiments, the first inner ring-shaped well thickness, $t_1$, is substantially similar to the first outer ring-shaped well thickness, $t_2$. In yet other embodiments, the first inner ring-shaped well thickness, $t_1$, may be greater than the first outer ring-shaped well thickness, $t_2$. For example, the first inner ring-shaped well thickness, $t_1$, may be twice the first outer ring-shaped well thickness, $t_2$.

In some embodiments, the second device region 102b and the second devices 104b are arranged in a similar manner as the first device region 102a and the first devices 104a. For example, the second device region 102b is surrounded by a second inner ring-shaped well 106b, and the second inner ring-shaped well 106b is surrounded by a second outer ring-shaped well 108b. In some embodiments, the perimeter of the second outer ring-shaped well 108b defines the perimeter of the second IC region 112b. The second inner ring-shaped well 106b has a thickness, $t_3$, and the second outer ring-shaped well 108b has a thickness, $t_4$.

A plurality of dishing prevention dummy gates 114 are disposed over an upper surface of the first inner ring-shaped well 106a, the first outer ring-shaped well 108a, first inner isolation structure 107a, and the first outer isolation structure 109a. In some embodiments, the plurality of dishing prevention dummy gates 114 are disposed partially over or completely over the upper surface of the first inner ring-shaped well 106a, the first outer ring-shaped well 108a, first inner isolation structure 107a, and the first outer isolation structure 109a in a vertical direction. In addition, a plurality of dishing prevention dummy gates 114 are disposed over an upper surface of the second inner ring-shaped well 106b, the second outer ring-shaped well 108b, a second inner isolation structure 107b, and a second outer isolation structure 109b. In some embodiments, the plurality of dishing prevention dummy gates 114 are disposed partially over or completely over the upper surface of the second inner ring-shaped well 106b, the second outer ring-shaped well 108b, a second inner isolation structure 107b, and a second outer isolation structure 109b in a vertical direction. In further embodiments, the dishing prevention dummy gates 114 comprise a conductive material (e.g., metal, polysilicon, silicide, etc.). In further embodiments, the dishing prevention dummy gates 114 are electrically floating (e.g., a voltage is not applied to the dummy gates 114 during operation of the integrated circuit 100).

Further, while the dishing prevention dummy gates 114 are shown as quadrilaterals, it will be appreciated that the dishing prevention dummy gates 114 may have varying shapes and sizes. In some embodiments, the varying shapes and sizes may be based, at least in part, on the type of devices (e.g., low voltage, mid-voltage, or high voltage) disposed within the first device region 102a and/or the second device region 102b, or on the composition of the material (e.g., polysilicon, aluminum, tantalum, copper, etc.) of dishing prevention dummy gates 114. By basing the varying shapes and sizes of the dishing prevention dummy gates 114 on the foregoing properties, the dishing prevention dummy gates 114 may prevent unwanted dishing from occurring over the first device region 102a and/or the second device region 102b during a subsequent CMP process by acting as support pillars for a surrounding material (e.g., a dielectric material disposed over the first devices 104a disposed in the first device region 102a). Accordingly, by reducing the amount of dishing, the performance of the first devices 104a and the second devices 104b may be improved and the cost of manufacturing the IC 100 may be reduced.

Figure 2:
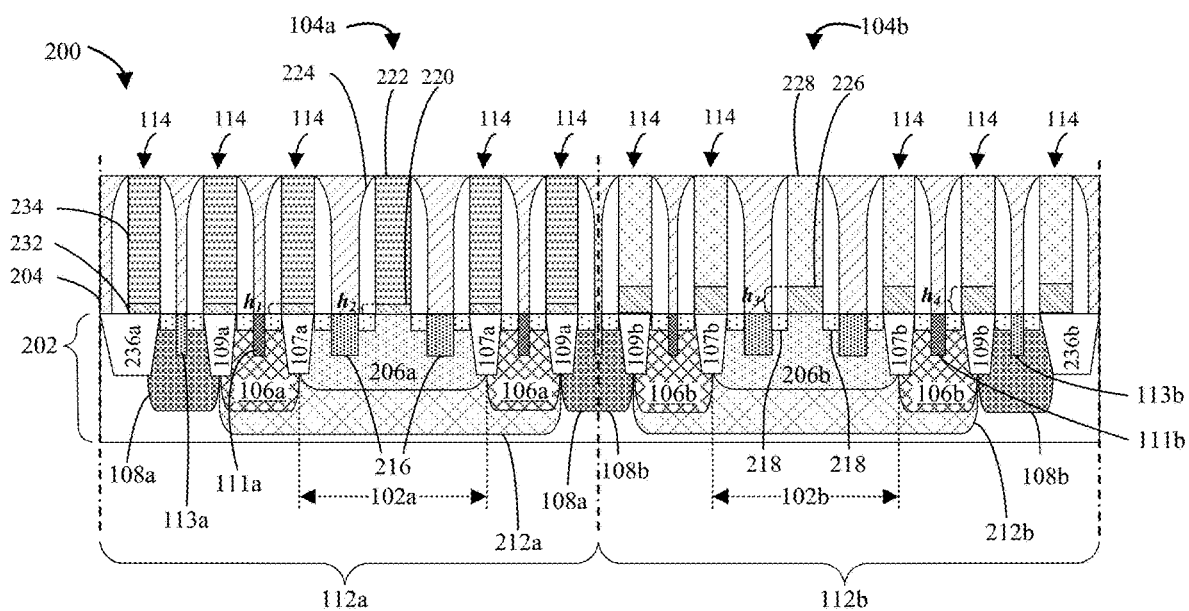
FIG. 2 illustrates a cross-sectional view of some embodiments of an integrated circuit comprising first and second IC regions having dishing prevention dummy gates.

FIG. 2 illustrates a cross-sectional view of some embodiments of an integrated circuit 200 comprising first and second IC regions having dishing prevention dummy gates.

The integrated circuit 200 comprises a semiconductor substrate 202 including the first inner ring-shaped well 106a, the first outer ring-shaped well 108a, the second inner ring-shaped well 106b, and the second outer ring-shaped well 108b. The semiconductor substrate 202 may comprise any type of semiconductor body (e.g., monocrystalline silicon/CMOS bulk, silicon-germanium (SiGe), silicon on insulator (SOI), etc.) and may be doped with the second doping type (e.g., p-type). The first inner ring-shaped well 106a may be a continuous ring-shaped region of the semiconductor substrate 202 that surrounds the first device region 102a and comprises the first doping type (e.g., n-type). The ring-shaped region of the first inner ring-shaped well 106a may be, for example, a circle, semi-circle, ellipse, quadrilateral, etc. In some embodiments, the first inner ring-shaped well 106a extends below a bottom surface of the first inner isolation structure 107a. The first inner ring-shaped well 106a further comprises a first inner highly doped region of the first inner highly doped region 111a, to which a contact (not shown) may be coupled. The first inner ring-shaped well 106a is separated from the first device region 102a by the first inner isolation structure 107a. The first inner isolation structure 107a may be, for example, a circle, semi-circle, ellipse, quadrilateral, etc. In some embodiments, the first inner isolation structure 107a may be concentric about the first device region 102a.

The first device region 102a includes a first device well 206a. In some embodiments, the first device well 206a may be disposed within a first deep well 212a that underlies the first device well 206a. The first device well 206a comprises a doping type (e.g., n-type or p-type) that depends on the function of the first device 104a. In some embodiments, the first device well 206a is separated from the first inner ring-shaped well 106a by the first inner isolation structure 107a. On the other hand, the first deep well 212a may extend below the first device region 102a, the first inner ring-shaped well 106a, and a portion of the first outer isolation structure 109a to contact the first outer ring-shaped well 108a below a bottom surface of the first outer isolation structure 109a. The first deep well 212a comprises the first doping type (e.g., n-type).

Further, a pair of source/drain regions 216 laterally spaced from one another are arranged in the first device well 206a. Moreover, a pair of source/drain extensions 218 are laterally spaced and disposed between the pair of source/drain regions 216 in the first device well 206a. For clarity in the figures, a single first device well region 206a is depicted in the first device region 102a, and one pair of the pair of source/drain extension 218 is labeled. However, because the first device region 102a may comprise a plurality of first devices 104a, the first device region 102a may comprise a plurality of first device well regions 206a disposed throughout the first device region 102a each having a pair of source/drain regions 216 and a pair of source/drain extensions 218, in which the doping may vary depending on the doping type of the first device well 206a.

In some embodiments, the first outer ring-shaped well 108a is a continuous ring-shaped region of the semiconductor substrate 202 that surrounds the first inner ring-shaped well 106a and comprises the second doping type (e.g., p-type), which is different than the first doping type. The ring-shaped region of the first outer ring-shaped well 108a may be, for example, a circle, semi-circle, ellipse, quadrilateral, etc. In some embodiments, the first outer ring-shaped well 108a extends below a bottom surface of the first outer isolation structure 109a and contacts a portion of the first inner ring-shaped well 106a. The first outer ring-shaped well 108a further comprises a first outer highly doped region 113a of the first outer ring-shaped well 108a, in which a contact (not shown) may be coupled. The first outer ring-shaped well 108a is separated from the first inner ring-shaped well 106a by the first outer isolation structure 109a. The first outer isolation structure 109a may be, for example, a circle, semi-circle, ellipse, quadrilateral, etc. In some embodiments, the first outer isolation structure 109a may be concentric about the first outer ring-shaped well 108a. In some embodiments, a first IC region isolation structure 236a (e.g., STI) is disposed on a first side of the first outer ring-shaped well 108a. In some embodiments, the first outer ring-shaped well 108a and the second outer ring-shaped well 108b share a common doping region disposed between the first IC region 112a and the second IC region 112b. In such an embodiment, a mid-point of the common doping region may define a side of the first IC region 112a and a side of the second IC region 112b.

A device gate electrode 222 is disposed over the first device well 206a and is separated from the semiconductor substrate 202 by a device gate dielectric 220. Sidewall spacers 224 are disposed along sidewalls of the device gate electrode 222 and the device gate dielectric 220. The device gate electrode 222, the device gate dielectric 220, and the sidewall spacers 224 are disposed within an interlayer dielectric (ILD) layer 204. The ILD layer 204 may comprise, for example, phosphosilicate glass (PSG), borophosphosilicate glass (BPSG), silicon dioxide ($SiO_2$), or some other suitable dielectric.

In some embodiments, the first devices 104a may be low voltage devices and have a low voltage gate dielectric 220, a low voltage gate electrode 222, and sidewall spacers 224. On the other hand, in further embodiments, the second device 104b may be a mid-voltage device having a mid-voltage gate dielectric 226, a mid-voltage gate electrode 228, and sidewall spacers 224, a pair of source/drain regions 216 disposed in the second device well 206b, a pair of source/drain extensions 218 disposed in the second device well 206b, and the second device well 206b. In some embodiments, the low voltage gate electrode 222 and the mid-voltage gate electrode 228 comprise a conductive material (e.g., aluminum, copper, tantalum, or some other suitable material).

A plurality of dishing prevention dummy gates 114 are disposed within the ILD layer 204. The dishing prevention dummy gates 114 are arranged over the semiconductor substrate 202 and are positioned over various regions of the first IC region 112a and the second IC region 112b. In some embodiments, dishing prevention dummy gates 114 are arranged over the first/second inner isolation structures 107a/107b, the first/second outer isolation structures 109a/109b, and the first/second IC region isolation structures 236a/236b. The dishing prevention dummy gates 114 may also be arranged elsewhere in the first IC region 112a and the second IC region 112b. For example, the dishing prevention dummy gates 114 may be placed over the first/second inner highly doped region 111a/111b or the first/second outer highly doped region 113a/113b. By placing the dishing prevention dummy gates 114 various locations across the first IC region 112a and the second IC region 112b, the dishing prevention dummy gates 114 may prevent unwanted dishing from occurring over the first device region 102a and the second device region 102b during a subsequent CMP process by acting as support pillars for the ILD layer 204. Accordingly, by reducing the amount of dishing, the performance of the first devices 104a and the second devices 104b may be improved and the cost of manufacturing the IC 200 may be reduced.

The dishing prevention dummy gates 114 are typically incorporated into the same processing steps that are used to form the gate stacks of the first device region 102a and the second device region 102b. Thus, in some embodiments, the dishing prevention dummy gates 114 include a dummy gate dielectric 232, a dummy gate 234, and sidewall spacers 224. The dummy gate 234 may comprises, for example, polysilicon, aluminum, copper, tantalum, or some other suitable material.

Further, to ensure uniform removal of the ILD layer 204, the dishing prevention dummy gates 114 may have similar geometrical dimensions (e.g., a similar gate electrode height/width/depth, gate oxide height/width/depth, and/or sidewall spacer height/width/depth) as the features of the devices 104a/104b nearest the dishing prevention dummy gates 114. For example, in some embodiments, the first devices 104a are low voltage devices and the device gate electrode 222 may comprise metal and the device gate dielectric 220 may comprise a high-k dielectric, which may be referred to as a high-k metal gate (HKMG) devices. Accordingly, the dishing prevention dummy gates 114 proximate the HKMG devices may have similar features and dimensions as the HKMG devices in the first device region 102a. On the other hand, the second devices 104b may be mid-voltage devices and the device gate electrode 222 may be a fully silicided (FUSI) gate. Accordingly, the dishing prevention dummy gates 114 proximate the FUSI gate devices may have similar features and dimensions as the FUSI gate devices in the second device region 102b. In other embodiments, additional processes (e.g., photolithography, etching, anneals) may be used to form the dishing prevention dummy gates, such that the features and geometries of the dishing prevention dummy gates 114 are not similar to the features of the proximate devices.

In some embodiments, the dummy gate dielectrics 232 of the dishing prevention dummy gates 114 disposed in the first IC region 112a have a first dummy gate dielectric height, $h_1$, and the device gate dielectrics 220 of the first devices 104a have a first device gate dielectric height, $h_2$. The dummy gate dielectrics 232 of the dishing prevention dummy gates 114 disposed in the second IC region 112b have a second dummy gate dielectric height, $h_3$, and the device gate dielectrics 226 of the second devices 104b have a second device dielectric height, $h_4$. In some embodiments, the first dummy gate dielectric height, $h_1$, is substantially the same as the first device gate dielectric height, $h_2$, and the second dummy gate dielectric height, $h_3$, is substantially the same as the second device dielectric height, $h_4$.

Because some of the features described above are arranged in a similar manner in both the first IC region 112a and the second IC region 112b, some features are only described with reference to the first IC region 112a. However, it will be appreciated that in some embodiments the description of these features also pertains to similar features in the second IC region 112b.

Figure 3A:
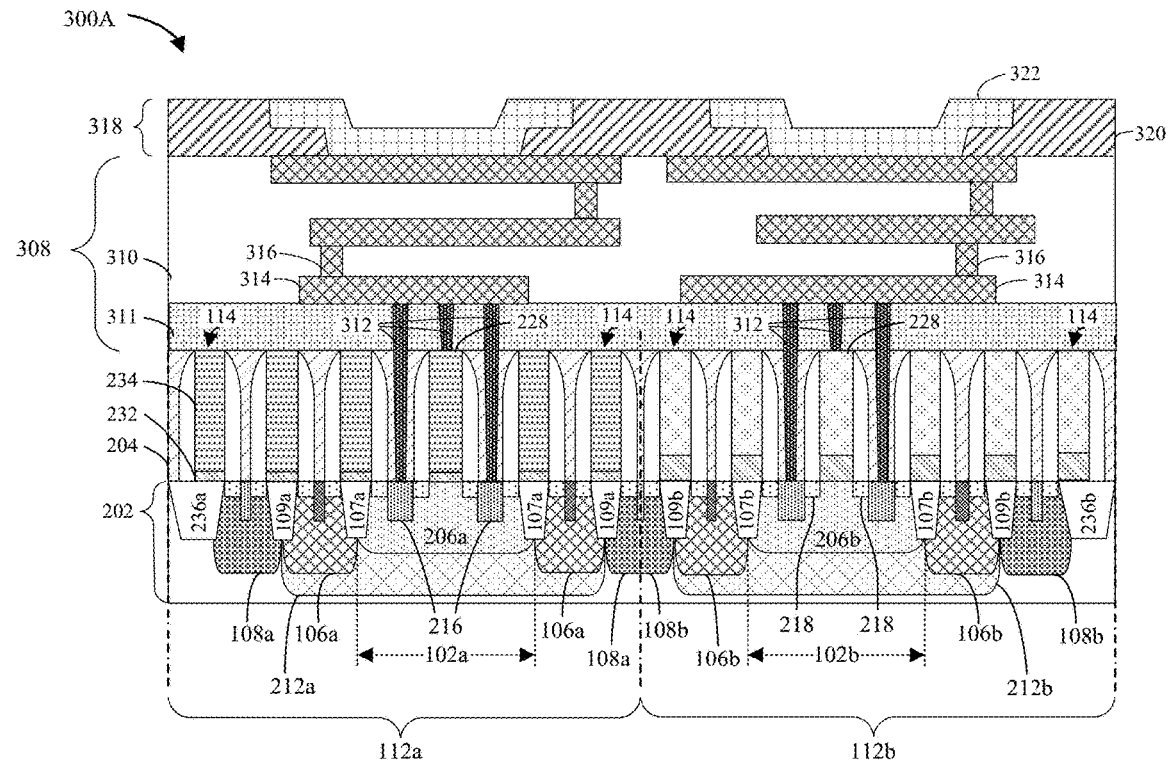
FIG. 3A illustrates a cross-sectional view of some more detailed embodiments of an integrated circuit comprising first and second IC regions having dishing prevention dummy gates.

FIG. 3A illustrates a cross-sectional view of some more detailed embodiments of an integrated circuit 300A comprising first and second IC regions having dishing prevention dummy gates.

In some embodiments, the IC 300A comprises an interconnect structure 308 that is arranged over the ILD layer 204. The interconnect structure 308 may comprise a plurality of inter-metal dielectric (IMD) layers 310-311. In some embodiments, a first IMD layer 311 is disposed over a top surface of the ILD layer 204. The IMD layers 310-311 may comprise, for example, one or more layers of an oxide, a low-k dielectric, or an ultra-low-k dielectric. The IMD layers 310-311 may surround contacts 312, metal wires 314, and metal vias 316 that comprise, for example, copper, tungsten, and/or aluminum. For example, the contacts 312 are configured to electrically couple the pair of source/drain regions 216 of the first devices 104a and the second devices 104b to a first metal wire 314 of the interconnect structure 308.

An under-bump metallization (UBM) stack 318 is arranged over the interconnect structure 308. In some embodiments, the UBM stack 318 comprises a passivation layer 320 and a UBM layer 322. In some embodiments, the passivation layer 320 comprises one or more layers of $SiO_2$, silicon nitride ($Si_3N_4$), polyimide compounds, or other suitable materials. The UBM layer 322 contacts an upper conductive feature (e.g., a contact pad) of the interconnect structure 308. The UBM layer 322 may comprise, for example, aluminum, titanium, tungsten, or some other suitable material. The UBM layer 322 is configured to provide an interface between an overlying solder bump (not shown) and an underlying conductive feature (e.g., a contact pad or a conductive trace) of the interconnect structure 308.

Figure 3B:
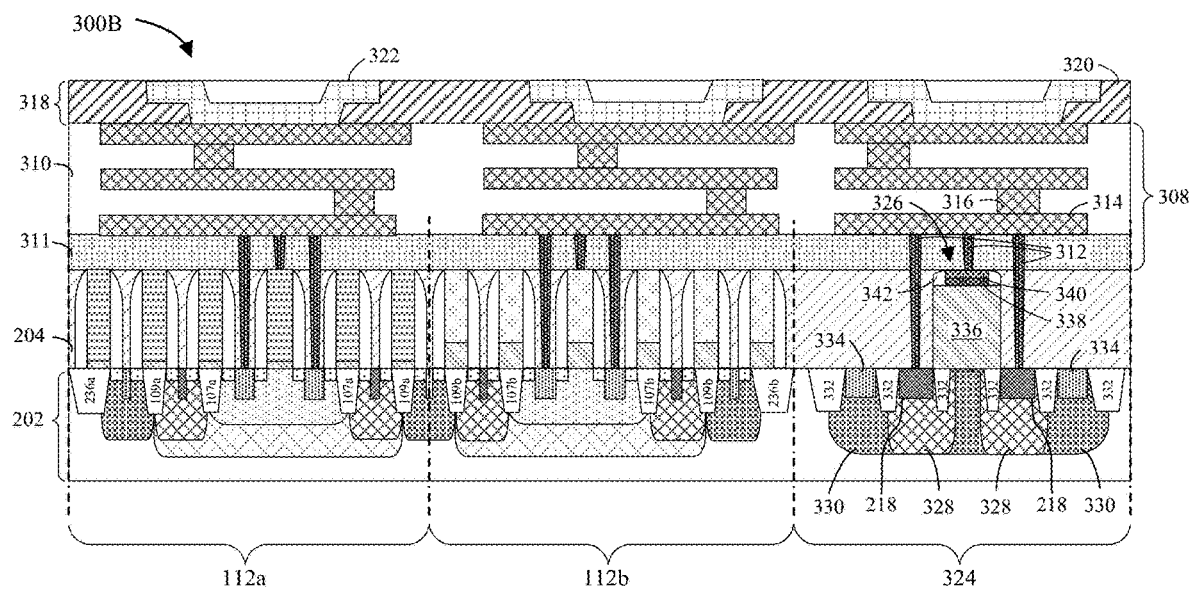
FIG. 3B illustrates a cross-sectional view of some embodiments of an integrated circuit comprising a first IC region having dishing prevention dummy gates and a second IC region having dishing prevention dummy gates disposed proximate a third device region.

FIG. 3B illustrates a cross-sectional view of some embodiments of an integrated circuit 300B comprising a first IC region having dishing prevention dummy gates and a second IC region having dishing prevention dummy gates disposed proximate a third device region.

The integrated circuit 300B comprises a third device region 324 arranged adjacent to the second IC region 112b. The third device region 324 may comprise a plurality of third devices 326. In some embodiments, the first IC region 112a comprises low voltage devices, the second IC region 112b comprises mid-voltage devices, and the third device region 324 comprises high-voltage devices. In some embodiments, the third device 326 comprises a high voltage n-well 328 disposed within the semiconductor substrate 202 and arranged within a high voltage p-well 330. A pair of source/drain regions 216 are also disposed within the semiconductor substrate 202 and are arranged within the high-voltage n-well 328. A plurality of isolation structures 332 are further disposed within the semiconductor substrate 202 and separate various features (e.g., the pair of source/drain regions 216 from highly doped regions of the high voltage p-well 334) of the third device 326.

The third device 326 may further comprise a high voltage oxide layer 336 that is disposed over the semiconductor substrate 202 and arranged between the pair of source/drain regions 216. A high voltage gate oxide layer 338 is arranged over the high voltage oxide layer 336 and separates the high voltage gate 340 from the high voltage oxide layer 336. In some embodiments, a pair of high voltage sidewall spacers 342 are arranged along sidewalls of the high voltage gate oxide layer 338 and the high voltage gate 340. The interconnect structure 308 and the UBM stack 318 are disposed over the third device region 324 to electrically couple features (e.g., pair of source/drain regions 216, high voltage gate 340, and/or highly doped regions of the high voltage p-well 334) of the third device region 324 to an input/output structure (e.g., a solder bump). In further embodiments, the third device 326 may be, for example, high voltage bipolar junction transistor, a vertical diffused metal oxide semiconductor (VDMOS) device, a laterally diffused metal oxide semiconductor (LDMOS) device, or some other power metal-oxide-semiconductor field-effect transistor (MOSFET).

With reference to FIGS. 4-19, a series of cross-sectional views of some embodiments of a method for forming a first IC region having dishing prevention dummy gates and a second IC region having dishing prevention dummy gates is provided.

Figure 4:
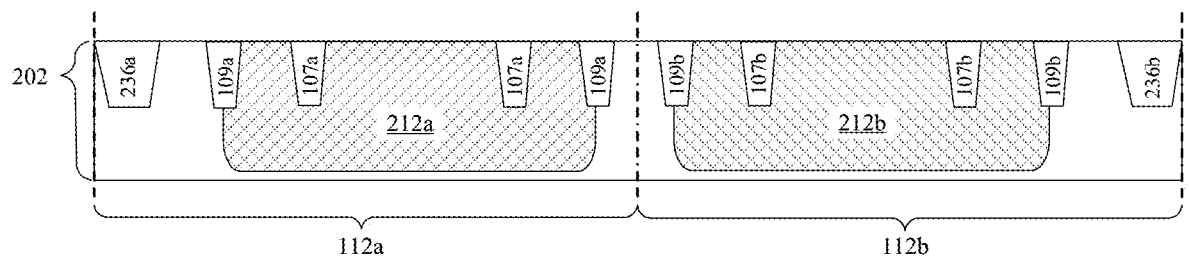
FIGS. 4-19 illustrate a series of cross-sectional views of some embodiments of a method for forming an integrated circuit comprising first and second IC regions having dishing prevention dummy gates.

As illustrated by FIG. 4, a first deep well region 212a, a second deep well region 212b, a first inner isolation structure 107a, a second inner isolation structure 107b, a first outer isolation structure 109a, a second outer isolation structure 109b, a first IC region isolation structure 236a, and a second IC region isolation structure 236b (collectively "isolation structures 107a/107b/109a/109b/236a/236b") are formed in the semiconductor substrate 202. In some embodiments, prior to forming the isolation structures 107a/107b/109a/109b/236a/236b, the first deep well region 212a and the second deep well region 212b are formed in the semiconductor substrate 202. The first deep well region 212a and the second deep well region 212b have a first doping type (e.g., p-type) and may, for example, be formed by ion implantation. Moreover, in some embodiments, a process for forming the isolation structures 107a/107b/109a/109b/236a/236b comprise performing an etch into the semiconductor substrate 202 to form trenches in the semiconductor substrate 202, and subsequently filling the trenches with a dielectric material. In yet further embodiments, the first inner isolation structure 107a demarcates a first device region 102a, and the second inner isolation structure 107b demarcates a second device region 102b.

Figure 5:
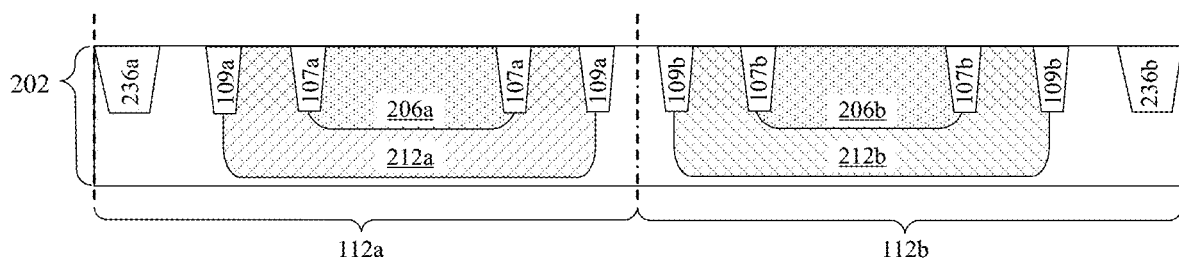

As illustrated by FIG. 5, a first device well 206a and a second device well 206b are formed within the semiconductor substrate 202. The first device well 206a and the second device well 206b have a second doping type (e.g., n-type). In some embodiments, the second doping type is different than the first doping type, and in other embodiments the first doping type and the second doping type are the same. The first device well 206a and the second device well 206b may, for example, be formed by ion implantation.

Figure 6:
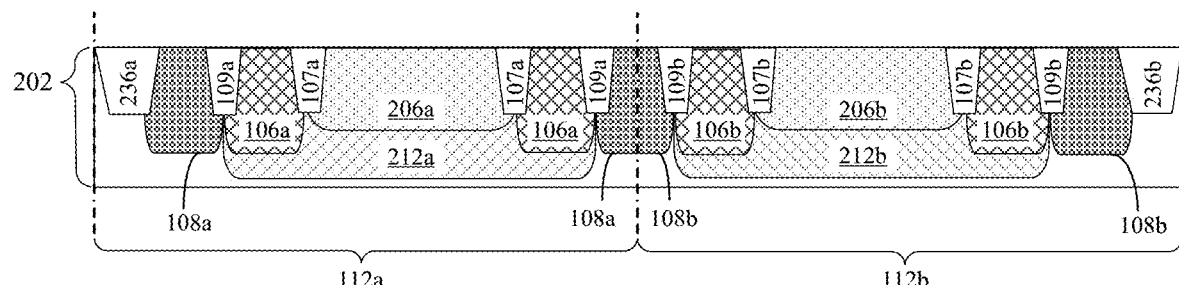

As illustrated by FIG. 6, a first inner ring-shaped well 106a, a second inner ring-shaped well 106b, a first outer ring-shaped well 108a, and a second outer ring-shaped well 108b are formed within the semiconductor substrate 202. In some embodiments, the first inner ring-shaped well 106a and the second inner ring-shaped well 106b have the first doping type (e.g., p-type), and the first outer ring-shaped well 108a and the second outer ring-shaped well 108b have the second doping type (e.g., n-type). The first inner ring-shaped well 106a, the second inner ring-shaped well 106b, the first outer ring-shaped well 108a, and the second outer ring-shaped well 108b may, for example, be formed by ion implantation. Accordingly, the first inner ring-shaped well 106a and the second inner ring-shaped well 106b act as a protection element (i.e., a guard ring) for devices disposed on the IC by collecting unwanted electrical signals that may propagate in/out of the first device region 102a or the second device region 102b, respectively, and disrupt (e.g., latch-up, unwanted activation, etc.) the function of the devices disposed on the IC. Further, the first inner ring-shaped well 106a in combination with the first outer ring-shaped well 108a and the second inner ring-shaped well 106b in combination with the second outer ring-shaped well 108b may provide junction isolation that prevents unwanted current from flowing in/out the first device region 102a or the second device region 102b, respectively, and disrupting the function of devices disposed on the IC.

Figure 7:
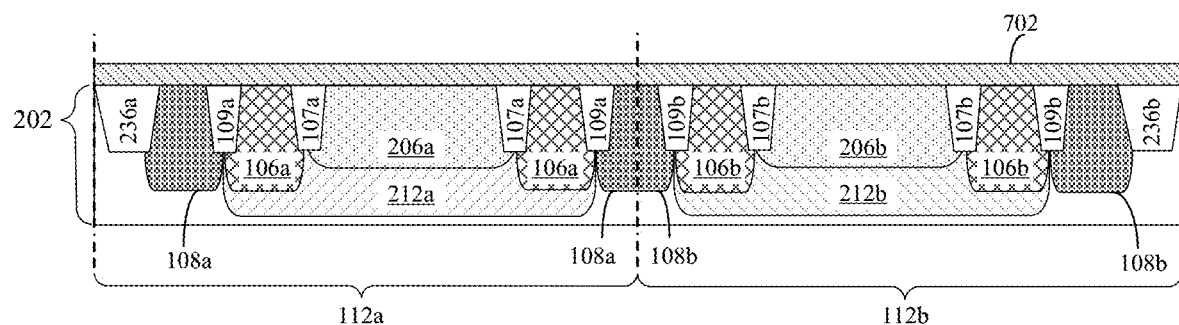

As illustrated by FIG. 7, a first gate dielectric layer 702 is formed over the semiconductor substrate 202. The first gate dielectric layer 702 is disposed over both the first IC region 112a and the second IC region 112b. The first gate dielectric layer 702 may, for example, be formed by thermal oxidation, chemical vapor deposition (CVD), physical vapor deposition (PVD), sputtering, or the like.

Figure 8:
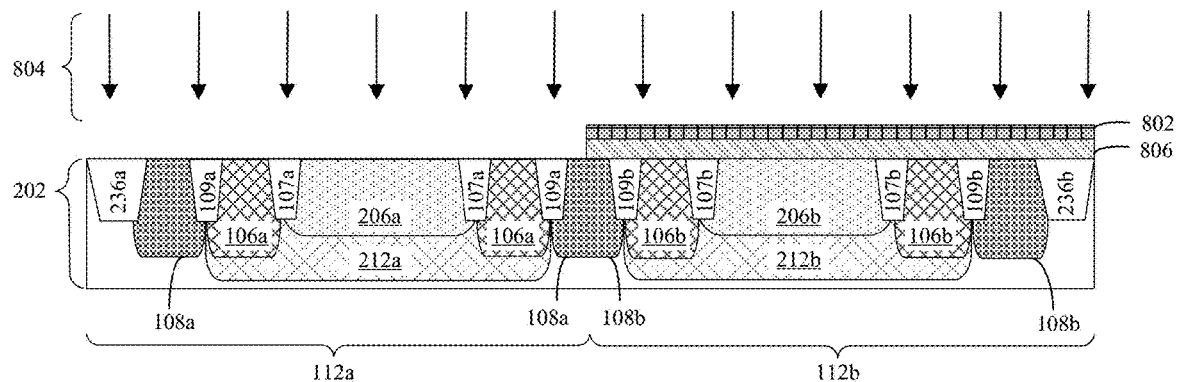

As illustrated by FIG. 8, a first photoresist mask 802 is formed over the first gate dielectric layer 702 by depositing a first photoresist layer (e.g., by a spin-on process) and selectively patterning the first photoresist layer (e.g., by a photolithography process). In some embodiments, the first photoresist mask 802 may, for example, be formed over the first IC region 112a but not over the second IC region 112b, or vice versa. With the first photoresist mask 802 in place, a first etch 804 (e.g., dry etch or wet etch) is performed into the first gate dielectric layer (702 of FIG. 7) to form a patterned first gate dielectric layer 806. In some embodiments, after the first etch 804 is performed, the first photoresist mask 802 is stripped away.

Figure 9:
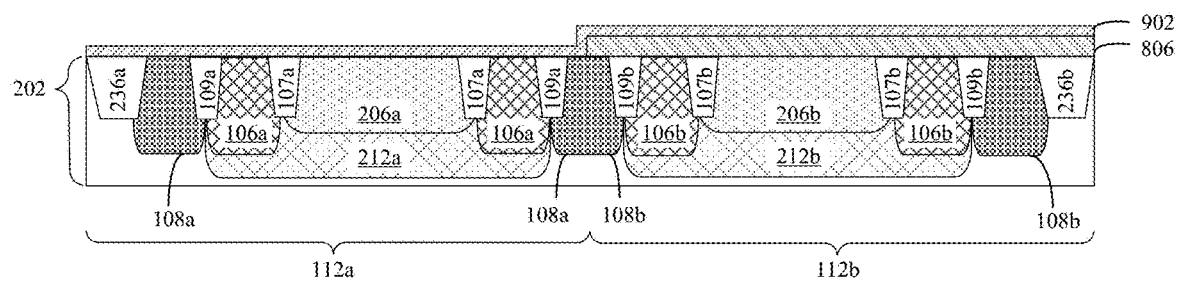

As illustrated by FIG. 9, a second gate dielectric layer 902 is formed over the semiconductor substrate 202 and the patterned first gate dielectric layer 806. The second gate dielectric layer 902 may, for example, be formed by thermal oxidation, CVD, PVD, sputtering, or the like. In some embodiments, the second gate dielectric layer 902 has a first upper surface over the first IC region 112a and a second upper surface over the second IC region 112b that is a greater distance from the semiconductor substrate 202 than the first upper surface of the second gate dielectric layer 902. In further embodiments, the patterned first gate dielectric layer 806 may have a thickness between about 100 angstrom and about 200 angstrom.

Figure 10:
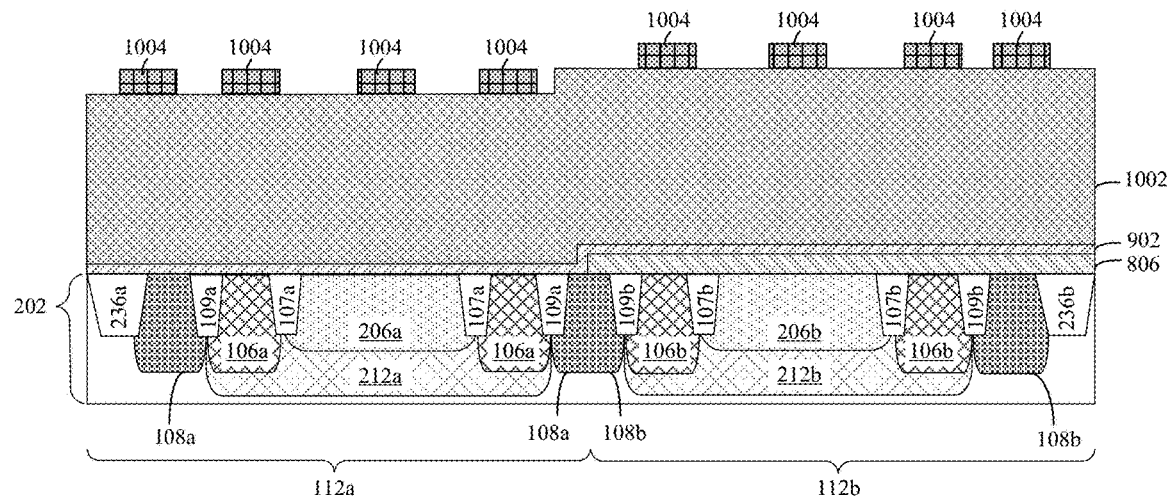

As illustrated by FIG. 10, a conductive layer 1002 is formed over the second gate dielectric layer 902. The conductive layer 1002 may, for example, comprise doped polysilicon, metal, or some other conductive material and may, for example, be formed by CVD, PVD, sputtering, or the like. In some embodiments, the conductive layer 1002 has a first upper surface over the first IC region 112a and second upper surface over the second IC region 112b that is a greater distance from the semiconductor substrate 202 than the first upper surface of the conductive layer 1002. In further embodiments, the second gate dielectric layer 902 may have a thickness between about 10 angstrom and about 20 angstrom.

Although FIG. 10 illustrates the conductive layer 1002 being formed on the second gate dielectric layer 902, in some additional embodiments, additional gate dielectric layers may be formed prior to forming the conductive layer 1002. A second photoresist mask 1004 is formed over the conductive layer 1002 by depositing a second photoresist layer (e.g., by a spin-on process) and selectively patterning the second photoresist layer (e.g., by a photolithography process). In some embodiments, the second photoresist mask 1004 is patterned such that the second photoresist mask 1004 covers portions of the conductive layer 1002 between isolation structures 107a/107b/109a/109b/236a/236b. In other embodiments, the second photoresist mask 1004 is patterned such that the second photoresist mask 1004 covers portions of the conductive layer 1002 over the isolation structures 107a/107b/109a/109b/236a/236b.

Figure 11:
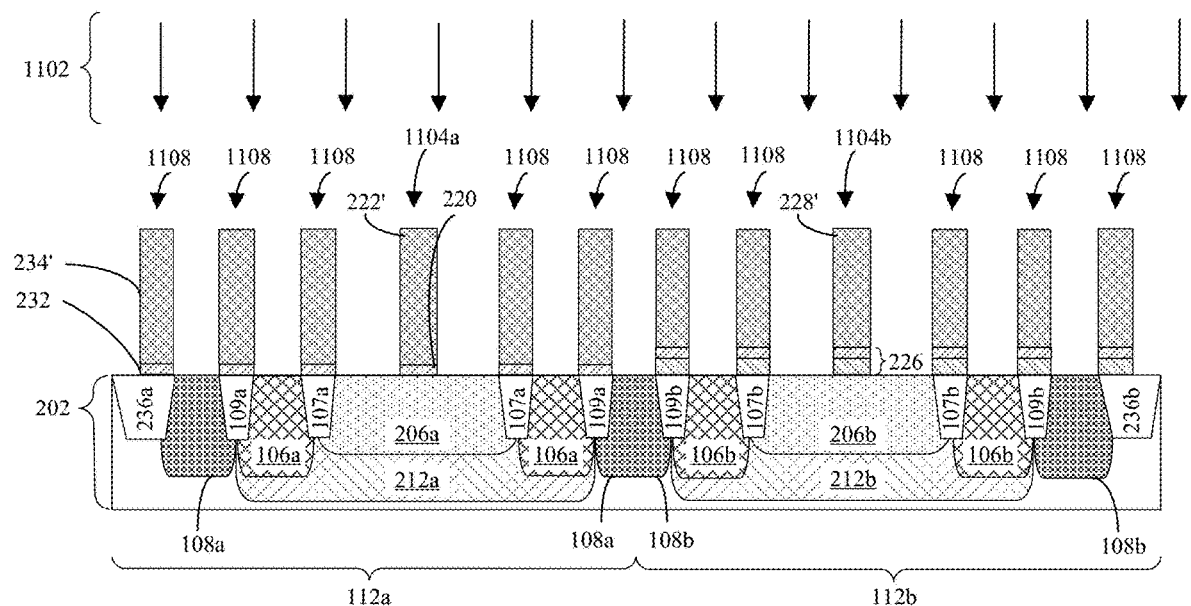

As illustrated by FIG. 11, with the second photoresist mask 1004 in place, a second etch 1102 (e.g., dry etch or wet etch) is performed into the conductive layer 1002, the second gate dielectric layer 902, and the patterned first gate dielectric layer 806 to form a plurality of dishing prevention dummy gate stacks 1108, a first device gate stack 1104a, and a second device gate stack 1104b. The first device gate stack 1104a comprises a first device gate electrode 222' disposed over a first device gate dielectric 220, and the second device gate stack 1104b comprises a second device gate electrode 228' disposed over a second device gate dielectric 226. The plurality of dishing prevention dummy gate stacks 1108 each comprise a dummy gate 234' disposed over a dummy gate dielectric 232. In some embodiments, the apostrophe mark in FIGS. 11-17 indicates that the first device gate electrode 222', the second device gate electrode 228', and the dummy gate 234' comprise an intermediate material (e.g., polysilicon) that may undergo a subsequent process (e.g., poly-gate replacement (RPG) high-k metal gate (HKMG) process, a fully silicided (FUSI) process, etc.) step that alters the composition of the intermediate material.

Depending on whether the dishing prevention dummy gate stacks 1108 are disposed in the first IC region 112a or the second IC region 112b, the dummy gate dielectric 232 will have a height similar to either the first device gate dielectric 220 or the second device gate dielectric 226, respectively. In some embodiments, a plurality of first device gate stacks 1104a are formed in the first IC region 112a and a plurality of second device gate stacks 1104b are formed in the second IC region 112b. In yet further embodiments, after the second etch 1102 is performed, the second photoresist mask 1004 is stripped away.

Figure 12:
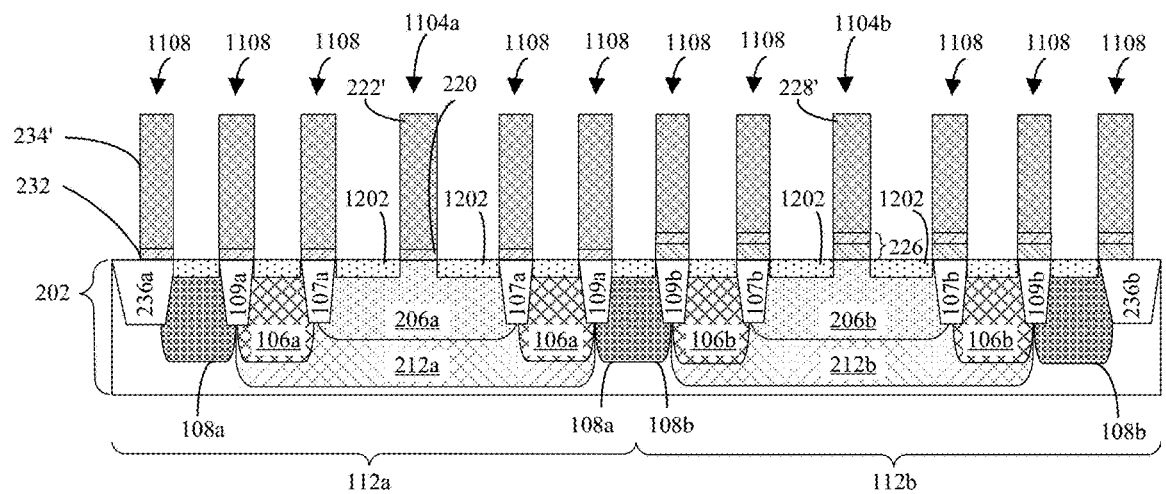

As illustrated by FIG. 12, in some embodiments, pairs of lightly-doped source/drain extensions 1202 are formed within the first IC region 112a and the second IC region 112b. In some embodiments, the pairs of lightly-doped source/drain extensions 1202 are formed within the semiconductor substrate 202 by, for example, ion implantation while using the dishing prevention dummy gates 114, the first device gate stack 1104a, and the second device gate stack 1104b as a mask. Because the dishing prevention dummy gates 114, the first device gate stack 1104a, and the second device gate stack 1104b may be used as a mask, the lightly-doped source/drain extensions 1202 may also be formed between the dishing prevention dummy gates 114. In other embodiments, a mask is formed to prevent implantation of the lightly-doped source/drain extensions 1202 between the dishing prevention dummy gates 114. The pairs of lightly-doped source/drain extensions 1202 comprise the first doping type or the second doping type, so that the source/drain extensions 1202 may have the same doping type or a different doping type than the region (e.g., the first inner ring-shaped well 106a) of semiconductor substrate 202 in which they are disposed.

Figure 13:
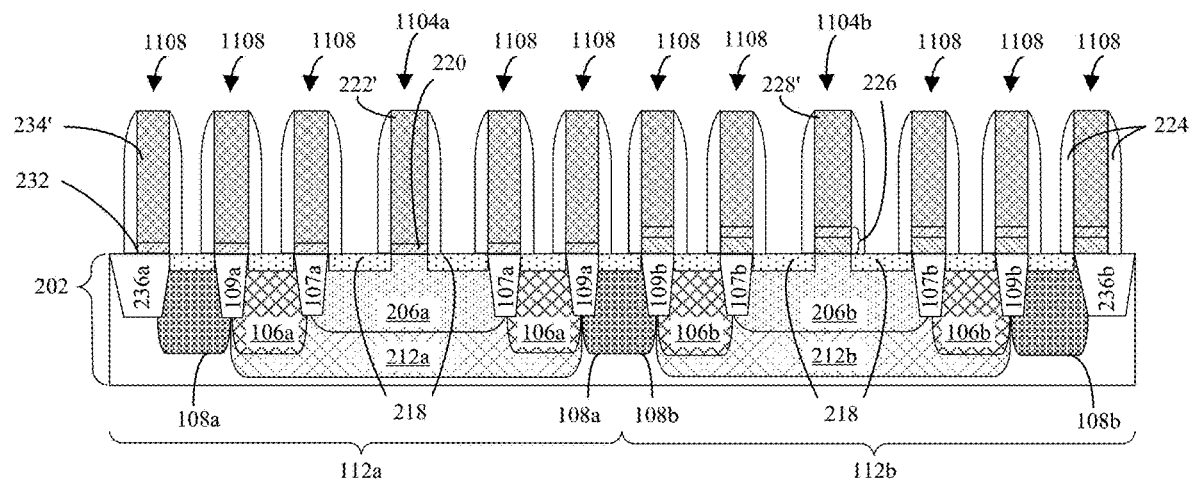

As illustrated by FIG. 13, sidewall spacers 224 are formed on sidewalls of the dishing prevention dummy gate stacks 1108; the first device gate stack 1104a; and the second device gate stack 1104b. In some embodiments, a mask is formed to prevent formation of the sidewall spacers 224 along the dishing prevention dummy gate stacks 1108. The sidewall spacers 224 may, for example, be silicon nitride, silicon dioxide, some other dielectric, or a combination of the foregoing. In some embodiments, a process for forming the sidewall spacers 224 comprises depositing or growing a spacer layer covering and conformally lining the structure in FIG. 11. The spacer layer may, for example, be deposited or grown by CVD, PVD, sputtering, or some other deposition or growth process. Further, in some embodiments, the process comprises performing an etch back into the spacer layer to remove horizontal segments of the spacer layer without removing vertical segments of the spacer layer.

Figure 14:
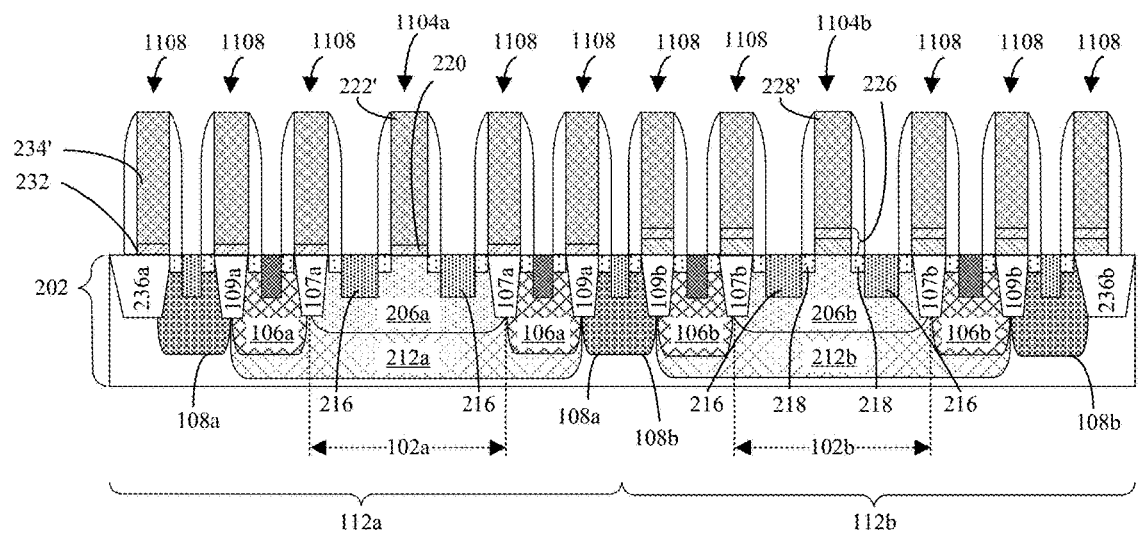

As illustrated by FIG. 14, pairs of source/drain regions 216 are formed in the semiconductor substrate 202 of the first IC region 112a and the second IC region 112b. In some embodiments, the pairs of source/drain regions 216 respectively adjoin pairs of the lightly-doped source/drain extensions 218 disposed between dishing prevention dummy gate stacks 1108, the first device gate stack 1104a, and the second device gate stack 1104b. In other embodiments, a mask is formed to prevent implantation of the pairs of source/drain regions 216 between two adjacent dishing prevention dummy gate stacks 1108. In some embodiments, the source/drain regions 216 are formed by, for example, ion implantation.

Figure 15:
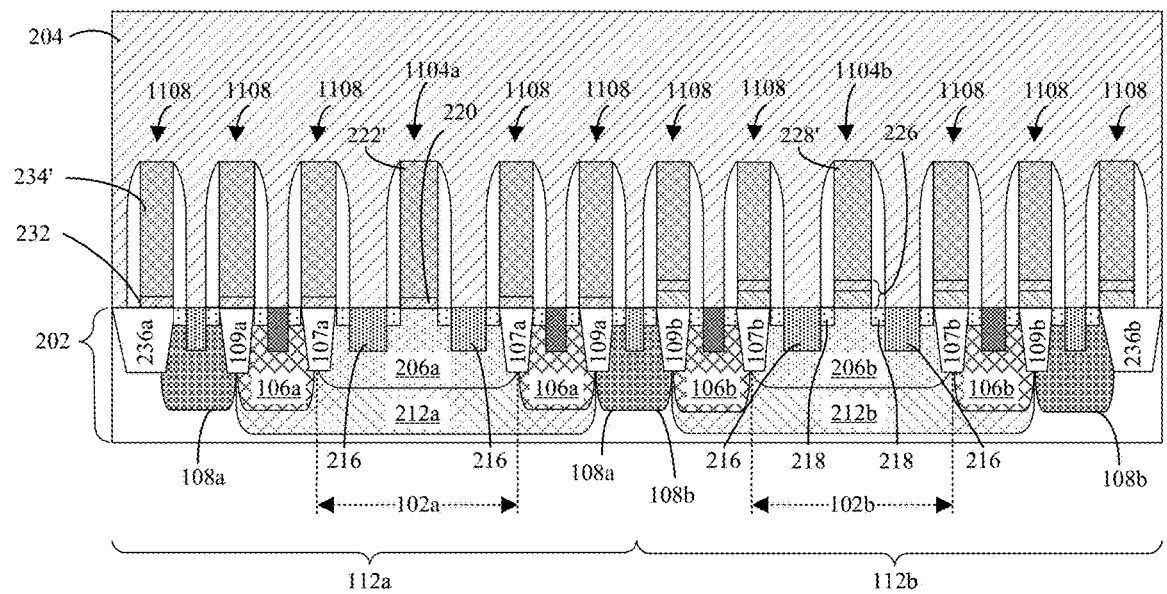

As illustrated by FIG. 15, a ILD layer 204 is formed over the semiconductor substrate 202. The ILD layer 204 may comprise one or more layers of, for example, PSG, BPSG, SiO$_2$, or some other suitable dielectric. The ILD layer 204 may, for example, be formed by CVD, PVD, sputtering, or one other deposition or growth process, or a combination of the foregoing.

Figure 16:
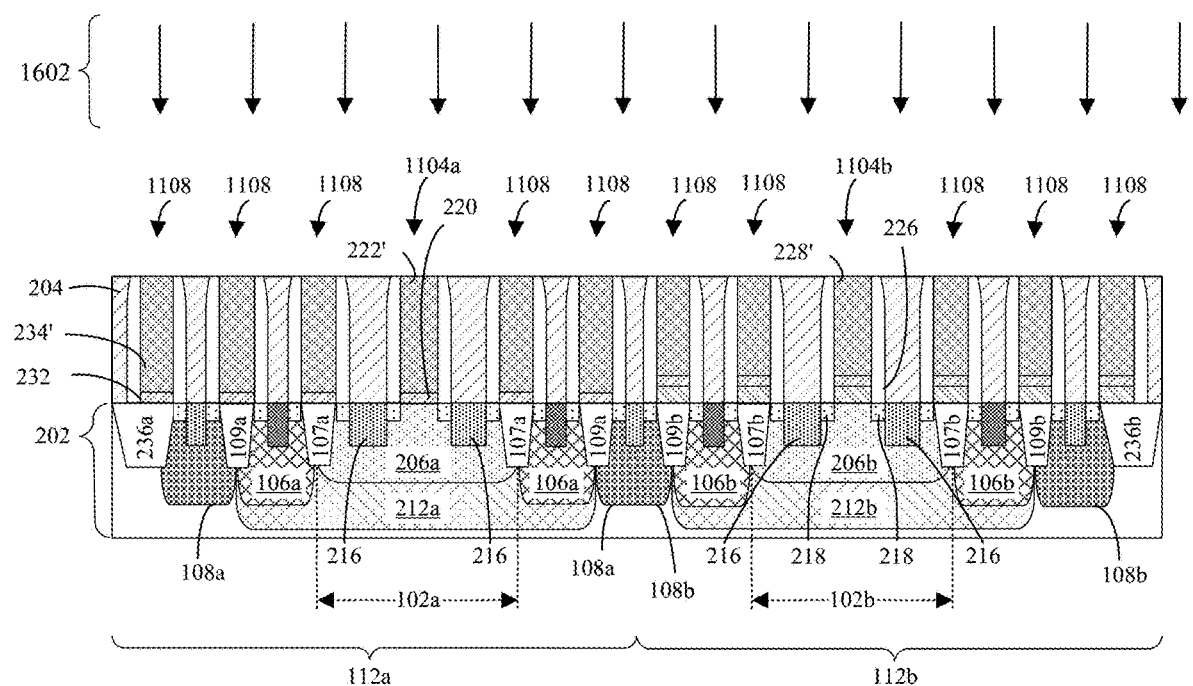

As illustrated by FIG. 16, the ILD layer 204 is planarized by a first planarization process 1602. The first planarization process 1602 may, for example, be a CMP process. The first planarization process 1602 reduces the height of the first device gate electrode 222', the second device gate electrode 228', and the dummy gates 234'. Accordingly, a top surface of the first device gate electrode 222', the second device gate electrode 228', and the dummy gates 234 are substantially co-planar with a top surface of the ILD layer 204.

Figure 17:
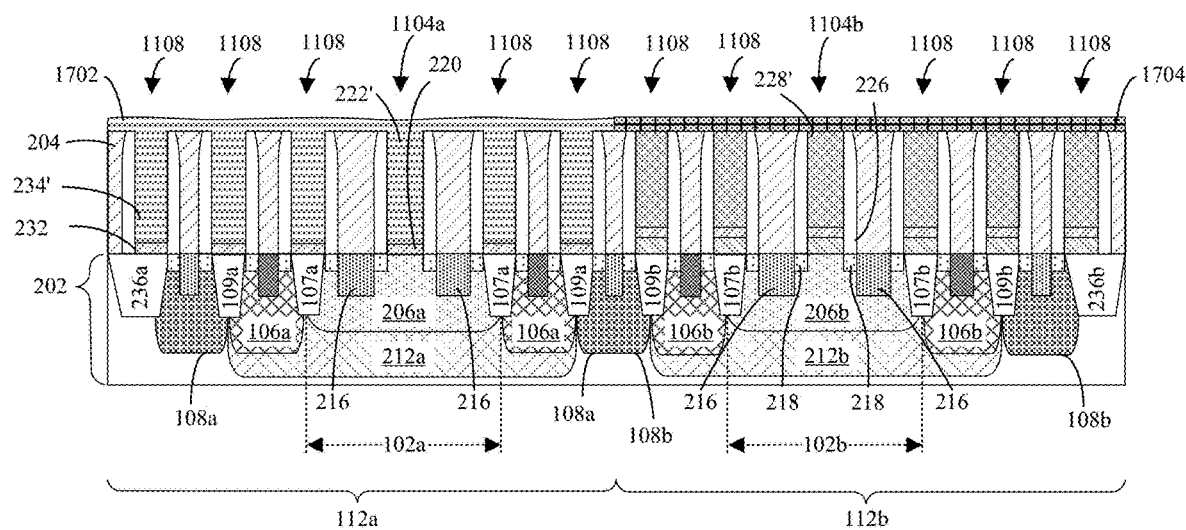

As illustrated by FIG. 17, a RPG HKMG process is performed. The dummy gates 234' disposed in the first IC region 112*a* and the first device gate electrode 222' are replaced with a metal material 1702 (e.g., aluminum, copper, tantalum, or some other conductive material) to form dummy gates 234 in the first IC region 112*a* and the first device gate electrode 222. In some embodiments, the dummy gates 234 in the first IC region 112*a* may be metal dummy gates 234 and the first device gate electrode 222 may be a first metal device gate electrode 222.

In some embodiments, the RPG HKMG process comprises forming a third photoresist mask 1704 is over the ILD layer 204 in the second IC region 112*b* to protect the dummy gates 234' disposed in the second IC region 112*b* and the second device gate electrode 228' from the RPG HKMG process. In further embodiments, the RPG HKMG process comprises a first etch process to remove the dummy gates 234' disposed in the first IC region 112*a* and the first device gate electrode 222'. After the dummy gates 234' disposed in the first IC region 112*a* and the first device gate electrode 222' are removed, the metal material 1702 is deposited in the openings in the ILD layer 204 formed by removing the dummy gates 234' disposed in the first IC region 112*a* and the first device gate electrode 222'. Thus, metal dummy gates 234 are formed in the first IC region 112*a*, and a first metal device gate electrode 222 is formed. Subsequently, the third photoresist mask 1704 is stripped away.

Figure 18:
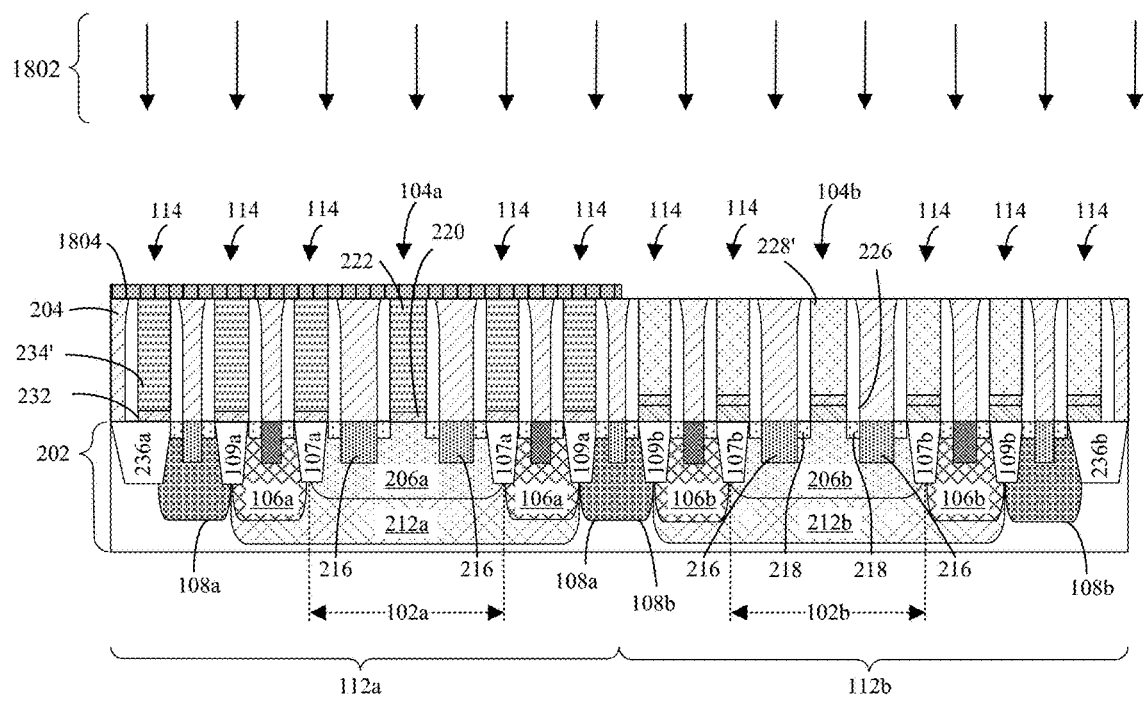

As illustrated by FIG. 18, in some embodiments, a FUSI process 1802 is performed on the dummy gates 234' disposed in the second IC region 112*b* and the second device gate electrode 228' to form dummy gates 234 in the second IC region 112*b* and the second device gate electrode 228. In some embodiments, the dummy gates 234 in the second IC region 112*b* may be fully silicided dummy gates 234 and the second device gate electrode 228 may be a second fully silicided device gate electrode 228. In some embodiments, before the FUSI process 1802 is performed, a second planarization process (e.g., a CMP process) is performed to remove excess metal material 1702 and planarize the dummy gates 234 in the first IC region 112*a* and the first device gate electrode 222.

Moreover, in some embodiments, a fourth photoresist mask 1804 is formed over the ILD layer 204 in the first IC region 112*a* to protect the dummy gates 234 in the first IC region 112*a* and the first device gate electrode 222 from the FUSI process. In some embodiments, the FUSI process may comprise forming a transition metal layer (not shown) (e.g., nickel) over the ILD layer 204 in the second IC region 112*b*. After the transition metal is formed, an anneal process is performed that causes the transition metal layer (not shown) to react with the dummy gates 234' disposed in the second IC region 112*b* and the second device gate electrode 228'. Accordingly, fully silicided dummy gates 234 are formed in the second IC region 112*b*, and the second fully silicided device gate electrode 222 is formed. In some embodiments, a third planarization process (e.g., a CMP process) is performed to planarize the dummy gates 234 in the second IC region 112*b* and the second device gate electrode 228.

Figure 19:
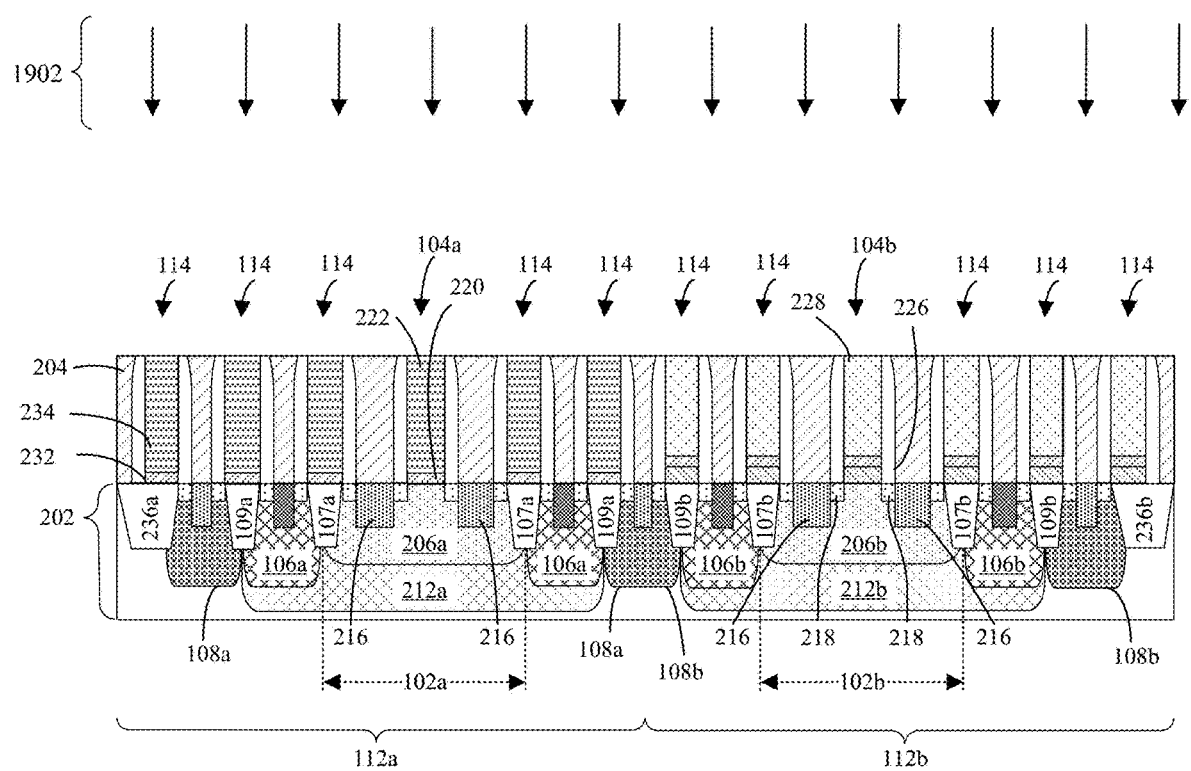

As illustrated by FIG. 19, a fourth planarization process 1902 is performed on the ILD layer 204. In some embodiments, the fourth planarization process 1902 is a CMP process suitable for planarizing features of a high voltage device region (e.g., 324 of FIG. 3). Due to the parameters of the fourth planarization process 1902, the fourth planarization process 1902 may cause dishing to occur in the first IC region 112*a* and the second IC regions 112*b*, which may result in decreased device performance. However, because the dishing prevention dummy gates 114 have been formed in the first IC region 112*a* and the second IC region 112*b*, the amount of dishing that occurs in the first IC region 112*a* and the second IC region 112*b* is reduced. Moreover, because the dummy gates 234 in the first IC region 112*a* and the first device gate electrode 222 are formed via a RPG HKMG process and the dummy gates 234 in the second IC region 112*b* and the second device gate electrode 228 are formed via a FUSI process, the amount of dishing that occurs over the first IC region 112*a* and the second IC region 112*b* may be further controlled and reduced. Thus, device performance may increase and the cost of manufacturing may be reduced.

Figure 20:
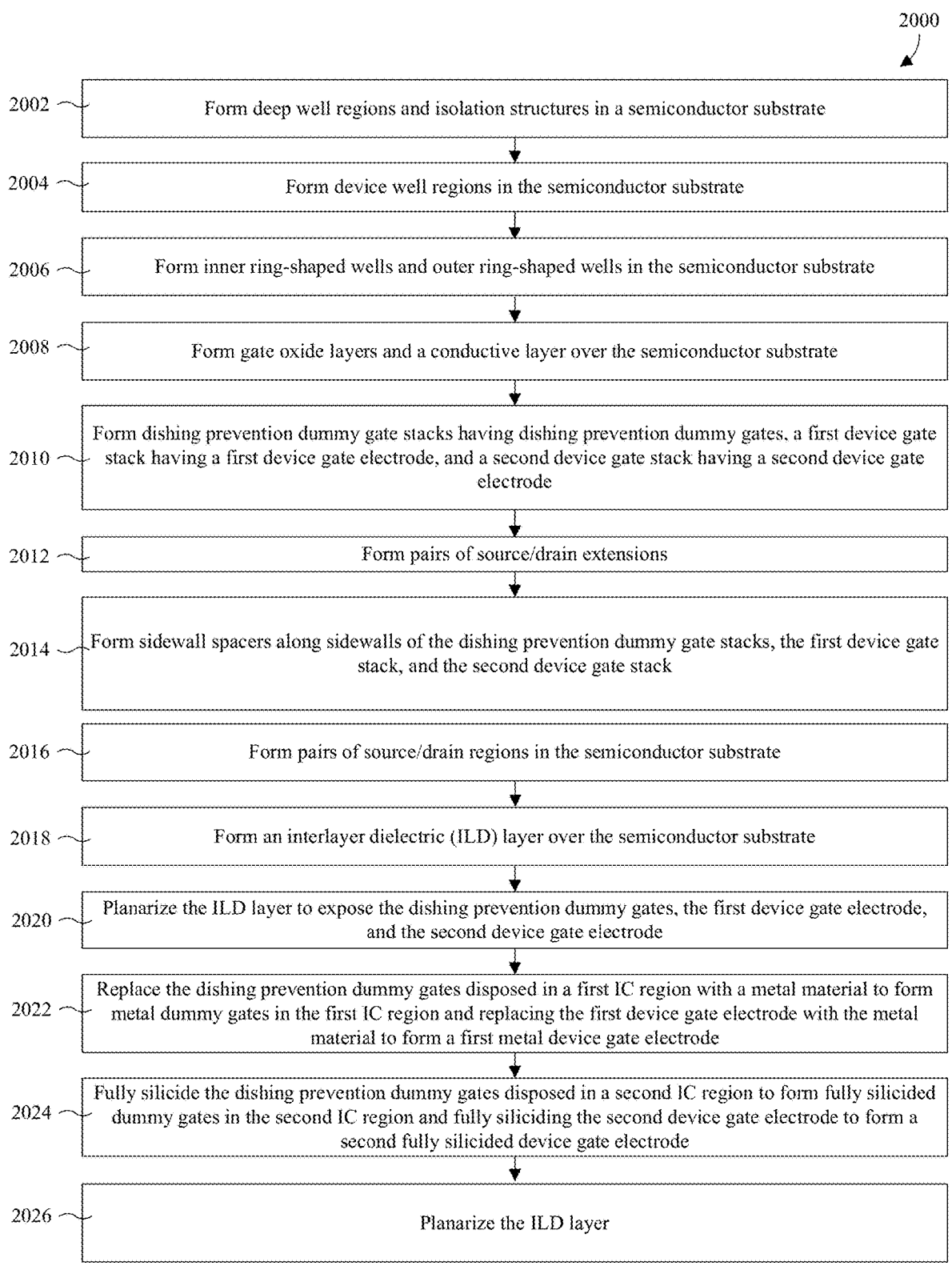
FIG. 20 illustrates a flowchart of some embodiments of the method for forming an integrated circuit comprising first and second IC regions having dishing prevention dummy gates.

With reference to FIG. 20, a flowchart 2000 of some embodiments of the method for forming a first IC region having dishing prevention dummy gates and a second IC region having dishing prevention gate is provided. While the flowchart 2000 of FIG. 20 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

At 2002, deep well regions and isolation structures are formed in the semiconductor substrate. FIG. 4 illustrates a cross-sectional view of some embodiments corresponding to act 2002.

At 2004, device well regions are formed in a semiconductor substrate. FIG. 5 illustrates a cross-sectional view of some embodiments corresponding to act 2004.

At 2006, inner ring-shaped wells and outer ring-shaped wells are formed in the semiconductor substrate. FIG. 6 illustrates a cross-sectional view of some embodiments corresponding to act 2006.

At 2008, gate oxide layers and a conductive layer are formed over the semiconductor substrate. FIGS. 7-10 illustrate a series of cross-sectional views of some embodiments corresponding to act 2008.

At 2010, dishing prevention dummy gate stacks having dishing prevention dummy gates, a first device gate stack having a first device gate electrode, and a second device gate stack having a second device gate electrode are formed. FIG. 11 illustrates a cross-sectional view of some embodiments corresponding to act 2010.

At 2012, pairs of source/drain extensions are formed within the semiconductor substrate. FIG. 12 illustrates a cross-sectional view of some embodiments corresponding to act 2012.

At 2014, sidewall spacers are formed along sidewalls of the dishing prevention dummy gate stacks, the first device gate stack, and the second device gate stack. FIG. 13 illustrates a cross-sectional view of some embodiments corresponding to act 2014.

At 2016, pairs of source/drain regions are formed within the semiconductor substrate. FIG. 14 illustrates a cross-sectional view of some embodiments corresponding to act 2016.

At 2018, an interlayer dielectric (ILD) layer is formed over the semiconductor substrate. FIG. 15 illustrates a cross-sectional view of some embodiments corresponding to act 2018.

At 2020, the ILD layer is planarized to expose the dishing prevention dummy gates, the first device gate electrode, and the second device gate electrode. FIG. 16 illustrates a cross-sectional view of some embodiments corresponding to act 2020.

At 2022, the dishing prevention dummy gates in a first IC region are replaced with a metal material to form metal dummy gates in the first IC region, and the first device gate electrode is replace with the metal material to from a first metal device gate electrode. FIG. 17 illustrates a cross-sectional view of some embodiments corresponding to act 2022.

At 2024, the dishing prevention dummy gates in a second IC region are fully silicided to form fully silicided dummy gates in the second IC region, and the second device gate electrode is fully silicided to form a second fully silicided device gate electrode. FIG. 18 illustrates a cross-sectional view of some embodiments corresponding to act 2024.

At 2026, the ILD layer is planarized. FIG. 19 illustrates a cross-sectional view of some embodiments corresponding to act 2026.

In view of the foregoing, some embodiments of the present application provide an integrated circuit (IC) having an inner ring-shaped isolation structure disposed in a semiconductor wafer, in which the inner ring-shaped isolation structure demarcates a device region. An inner-ring shaped well is disposed in the semiconductor and surrounds the inner ring-shaped isolation structure. A plurality of dummy gates are arranged over the inner ring-shaped well, in which the plurality of dummy gates are disposed within an inter-layer dielectric (ILD) layer.

Further, other embodiments of the present application provide an integrated circuit having a first IC region and a second IC region. The first IC region includes a first inner ring-shaped isolation structure disposed in a semiconductor substrate, in which the first inner ring-shaped isolation structure demarcates a first device region. The first IC region further includes a first inner-ring shaped well that is disposed in the semiconductor substrate and surrounds the first inner ring-shaped isolation structure. In addition, the first IC region includes a first dishing prevention dummy gate arranged over the first inner ring-shaped well, in which the first dishing prevention dummy gate is disposed in a dielectric layer. The second IC region includes a second inner ring-shaped isolation structure disposed in the semiconductor substrate, in which the second inner ring-shaped isolation structure demarcates a second device region. The second IC region further includes a second inner-ring shaped well that is disposed in the semiconductor substrate and surrounds the second inner ring-shaped isolation structure. In addition, the second IC region includes a second dishing prevention dummy gates arranged over the second inner ring-shaped well, in which the second dishing prevention dummy gate is disposed in the dielectric layer.

Further yet, other embodiments of the present application provide a method for forming an integrated circuit (IC). The method includes forming a first inner ring-shaped isolation structure in a semiconductor substrate, in which the first inner ring-shaped isolation structure demarcates a first device region. A first inner-ring shaped well is formed in the semiconductor substrate and surrounds the first inner ring-shaped isolation structure. A second inner ring-shaped isolation structure that is laterally spaced from the first inner ring-shaped isolation structure is formed in the semiconductor substrate, in which the second inner ring-shaped isolation structure demarcates a second device region. A second inner ring-shaped well is formed in the semiconductor substrate and surrounds the second inner ring-shaped isolation structure. A first dummy gate is formed over the first inner ring-shaped well. A first device gate electrode is formed over the first device region. A second dummy gate is formed over the second inner ring-shaped well. A second device gate electrode is formed over the second device region. The first dummy gate and the first device gate electrode are removed and replaced with a conductive material. The second dummy gate and the second device gate electrode are reacted with a transition metal. A chemical-mechanical planarization (CMP) process is performed on the IC.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC) comprising:
   an inner isolation structure disposed in a semiconductor substrate, wherein an inner perimeter of the inner isolation structure demarcates a device region;
   an inner ring-shaped well disposed in the semiconductor substrate and laterally surrounding the inner isolation structure;
   an outer isolation structure disposed in the semiconductor substrate and laterally surrounding both the inner ring-shaped well and the inner isolation structure; and
   a plurality of dishing prevention dummy gates arranged over both the inner ring-shaped well and the outer isolation structure, wherein a third dishing prevention dummy gate of the plurality of dishing prevention dummy gates comprises a third dummy gate dielectric disposed on the outer isolation structure, and wherein sidewalls of the third dummy gate dielectric are disposed within an inner perimeter of the outer isolation structure and an outer perimeter of the outer isolation structure.

2. The IC of claim 1, further comprising:
   an outer ring-shaped well disposed in the semiconductor substrate and laterally surrounding the outer isolation structure, wherein the outer ring-shaped well and the inner ring-shaped well have opposite doping types.

3. The IC of claim 1, wherein a thickness of the inner ring-shaped well is less than a shortest distance between the inner perimeter of the inner isolation structure and the outer perimeter of the outer isolation structure.

4. The IC of claim 1, wherein:
a first dishing prevention dummy gate of the plurality of dishing prevention dummy gates comprises a first dummy gate dielectric disposed on the inner isolation structure; and
sidewalls of the first dummy gate dielectric are disposed within the inner perimeter of the inner isolation structure and an outer perimeter of the inner isolation structure.

5. The IC of claim 1, wherein:
a second dishing prevention dummy gate of the plurality of dishing prevention dummy gates comprises a second dummy gate dielectric disposed on the inner ring-shaped well; and
sidewalls of the second dummy gate dielectric are disposed within an inner perimeter of the inner ring-shaped well and an outer perimeter of the inner ring-shaped well.

6. The IC of claim 1, wherein the inner ring-shaped well contacts both an outer perimeter of the inner isolation structure and the inner perimeter of the outer isolation structure.

7. The IC of claim 6, wherein:
a first dishing prevention dummy gate of the plurality of dishing prevention dummy gates comprises a first dummy gate dielectric disposed on the inner isolation structure; and
a second dishing prevention dummy gate of the plurality of dishing prevention dummy gates comprises a second dummy gate dielectric disposed on the inner ring-shaped well.

8. The IC of claim 7, further comprising:
an outer ring-shaped well disposed in the semiconductor substrate and laterally surrounding the outer isolation structure, wherein:
the outer ring-shaped well and the inner ring-shaped well have opposite doping types;
the outer ring-shaped well contacts the outer perimeter of the outer isolation structure; and
a fourth dishing prevention dummy gate of the plurality of dishing prevention dummy gates comprises a fourth dummy gate dielectric disposed on the outer ring-shaped well.

9. An integrated circuit (IC) comprising:
a first ring-shaped isolation structure disposed in a semiconductor substrate, wherein the first ring-shaped isolation structure demarcates a first device region;
a second ring-shaped isolation structure disposed in the semiconductor substrate and spaced from the first ring-shaped isolation structure, wherein the second ring-shaped isolation structure demarcates a second device region;
a first dummy gate disposed over both the first ring-shaped isolation structure and the second ring-shaped isolation structure; and
a second dummy gate disposed over both the first ring-shaped isolation structure and the second ring-shaped isolation structure, wherein a top surface of the first dummy gate has a first area and a top surface of the second dummy gate has a second area different than the first area.

10. The IC of claim 9, further comprising:
an outer ring-shaped well disposed in the semiconductor substrate, wherein the outer ring-shaped well extends between the first ring-shaped isolation structure and the second ring-shaped isolation structure and extends laterally around the first ring-shaped isolation structure and laterally around the second ring-shaped isolation structure.

11. The IC of claim 9, wherein:
the first dummy gate is one of a plurality of third dummy gates disposed over the first ring-shaped isolation structure and in a first IC region;
the second dummy gate is one of a plurality of fourth dummy gates disposed over the second ring-shaped isolation structure and in a second IC region;
the first IC region and the second IC region have a same area; and
a density of the plurality of third dummy gates is greater in the first IC region than a density of the plurality of fourth dummy gates in the second IC region.

12. The IC of claim 9, further comprising:
a first semiconductor device disposed in the first device region and having a first gate electrode, wherein a top surface of the first gate electrode has a third area that is substantially the same as the first area.

13. The IC of claim 12, further comprising:
a second semiconductor device disposed in the second device region and having a second gate electrode, wherein a top surface of the second gate electrode has a fourth area that is substantially the same as the second area.

14. The IC of claim 13, further comprising:
a fifth dummy gate disposed over both the first ring-shaped isolation structure and the second ring-shaped isolation structure and disposed between the first dummy gate and the second dummy gate, wherein a top surface of the fifth dummy gate has a fifth area different than both the first area and the second area.

15. An integrated circuit (IC) comprising:
a first inner isolation structure disposed in a semiconductor substrate, wherein the inner isolation structure demarcates a first device region;
a second inner isolation structure disposed in the semiconductor substrate and spaced from the first inner isolation structure, wherein the second inner isolation structure demarcates a second device region;
an outer ring-shaped well disposed in the semiconductor substrate and between the first inner isolation structure and the second inner isolation structure;
a first dishing prevention dummy gate disposed over both the first inner isolation structure and the outer ring-shaped well, wherein the first dishing prevention dummy gate comprises a first dummy gate having a first conductive material; and
a second dishing prevention dummy gate disposed over both the second inner isolation structure and the outer ring-shaped well, wherein both the first dishing prevention dummy gate and the second dishing prevention dummy gate are disposed between the first device region and the second device region, and wherein the second dishing prevention dummy gate comprises a second dummy gate having a second conductive material different than the first conductive material.

16. The IC of claim 15, further comprising:
a third dishing prevention dummy gate disposed over both the inner isolation structure and the second inner isolation structure and disposed between the first dishing prevention dummy gate and the second dishing prevention dummy gate, wherein a top surface of the third dishing prevention dummy gate has a first area, a top surface of the first dishing prevention dummy gate has a second area, and a top surface of the second dishing prevention dummy gate has a third area, and wherein the first area is different than both the second area and the third area.

17. The IC of claim 15, further comprising:
a first semiconductor device disposed in the first device region, wherein the first semiconductor device comprises a first gate electrode having the first conductive material; and
a second semiconductor device disposed in the second device region, wherein the second semiconductor device comprises a second gate electrode having the second conductive material.

18. The IC of claim 15, wherein:
the first dishing prevention dummy gate comprises a dummy gate dielectric disposed on the second inner isolation structure; and
sidewalls of the dummy gate dielectric are disposed within an inner perimeter of the second inner isolation structure and an outer perimeter of the second inner isolation structure.

19. The IC of claim 15, wherein:
the first dishing prevention dummy gate comprises a dummy gate dielectric disposed on the outer ring-shaped well; and
sidewalls of the dummy gate dielectric are disposed within an inner perimeter of the outer ring-shaped well and an outer perimeter of the outer ring-shaped well.

20. The IC of claim 9, further comprising:
a first dummy gate dielectric disposed between the first dummy gate and the semiconductor substrate; and
a second dummy gate dielectric disposed between the second dummy gate and the semiconductor substrate.

* * * * *